United States Patent
Tsuji

(10) Patent No.: US 7,050,154 B2
(45) Date of Patent: *May 23, 2006

(54) ILLUMINATION OPTICAL SYSTEM IN EXPOSURE APPARATUS

(75) Inventor: Toshihiko Tsuji, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/933,328

(22) Filed: Sep. 3, 2004

(65) Prior Publication Data

US 2005/0030509 A1 Feb. 10, 2005

Related U.S. Application Data

(62) Division of application No. 09/821,024, filed on Mar. 30, 2001, now Pat. No. 6,816,234.

(30) Foreign Application Priority Data

Mar. 30, 2000 (JP) .............................. 2000-093688

(51) Int. Cl.
   G03B 27/42 (2006.01)
   G03B 27/54 (2006.01)
   G03B 27/72 (2006.01)
(52) U.S. Cl. ............................. 355/67; 355/53; 355/71
(58) Field of Classification Search ................. 355/53, 355/67, 71; 362/268, 269; 359/618, 619, 359/620
See application file for complete search history.

(56) References Cited

U.S. PATENT DOCUMENTS

| | | | |
|---|---|---|---|
| 3,802,762 A | 4/1974 | Kiemle | 350/162 SF |
| 4,255,019 A | 3/1981 | Knop | 350/162 SF |
| 5,383,000 A | 1/1995 | Michaloski et al. | 355/67 |
| 5,638,211 A | 6/1997 | Shiraishi | 359/559 |
| 5,663,785 A | 9/1997 | Kirk et al. | 355/71 |

(Continued)

FOREIGN PATENT DOCUMENTS

| | | |
|---|---|---|
| EP | 0 486 316 A2 | 11/1991 |
| EP | 0 867 772 A2 | 9/1998 |
| JP | 4-225359 | 8/1992 |

(Continued)

OTHER PUBLICATIONS

Japanese Office Action dated Sep. 7, 2004, issued in corresponding Japanese patent application No. 2000-93688, with partial English translation.

*Primary Examiner*—Rodney Fuller
(74) *Attorney, Agent, or Firm*—Fitzpatrick, Cella, Harper & Scinto

(57) ABSTRACT

An illumination system for illuminating a surface by use of light from a light source, which includes an emission angle conserving optical unit effective to emit the light from the light source at a constant divergent angle, and a diffractive optical element for producing a desired light intensity distribution on a predetermined plane. The diffractive optical element is disposed at or adjacent to a position where light from the emission angle conserving optical unit is collected.

14 Claims, 10 Drawing Sheets

U.S. PATENT DOCUMENTS

| | | | |
|---|---|---|---|
| 5,684,567 A | 11/1997 | Shiozawa | 355/67 |
| 6,057,065 A | 5/2000 | Rolson | 430/5 |
| 6,095,667 A | 8/2000 | Kamihara et al. | 362/311 |
| 6,211,944 B1 | 4/2001 | Shiraishi | 355/53 |
| 6,233,071 B1 | 5/2001 | Orr et al. | 359/23 |
| 6,259,512 B1 | 7/2001 | Mizouchi | 355/67 |
| 6,285,855 B1 | 9/2001 | Tsuji | 359/618 |
| 6,392,742 B1 | 5/2002 | Tsuji | 355/67 |

FOREIGN PATENT DOCUMENTS

| | | |
|---|---|---|
| JP | 7-263313 | 10/1995 |
| JP | 10-70070 | 3/1998 |
| JP | 10-270312 | 10/1998 |
| JP | 11-54426 | 2/1999 |
| JP | 11-162837 | 6/1999 |
| JP | 11-176721 | 7/1999 |
| JP | 2001-135560 | 5/2001 |
| JP | 2001-284237 | 10/2001 |

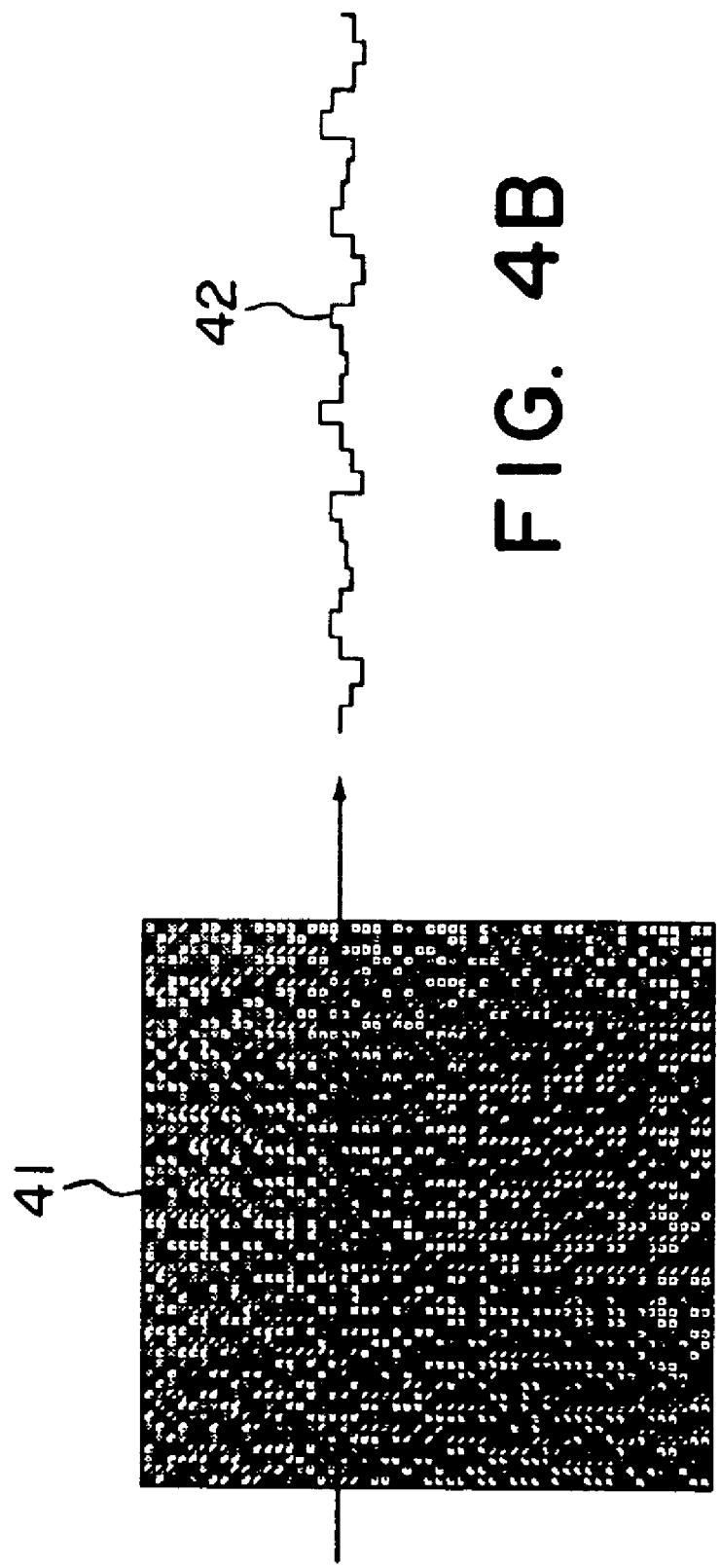

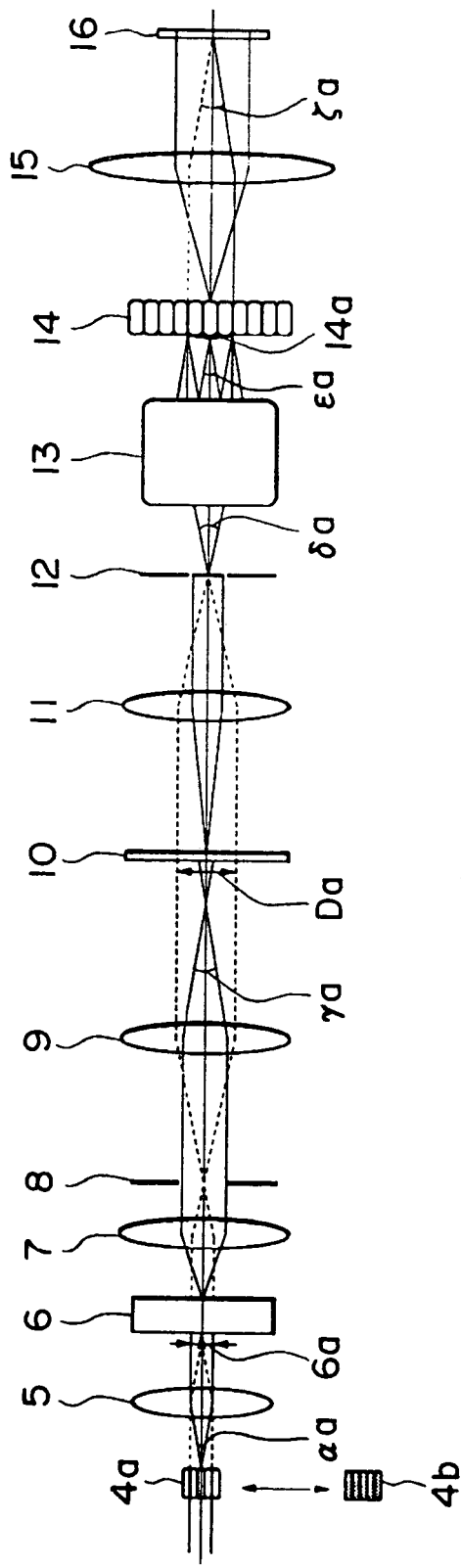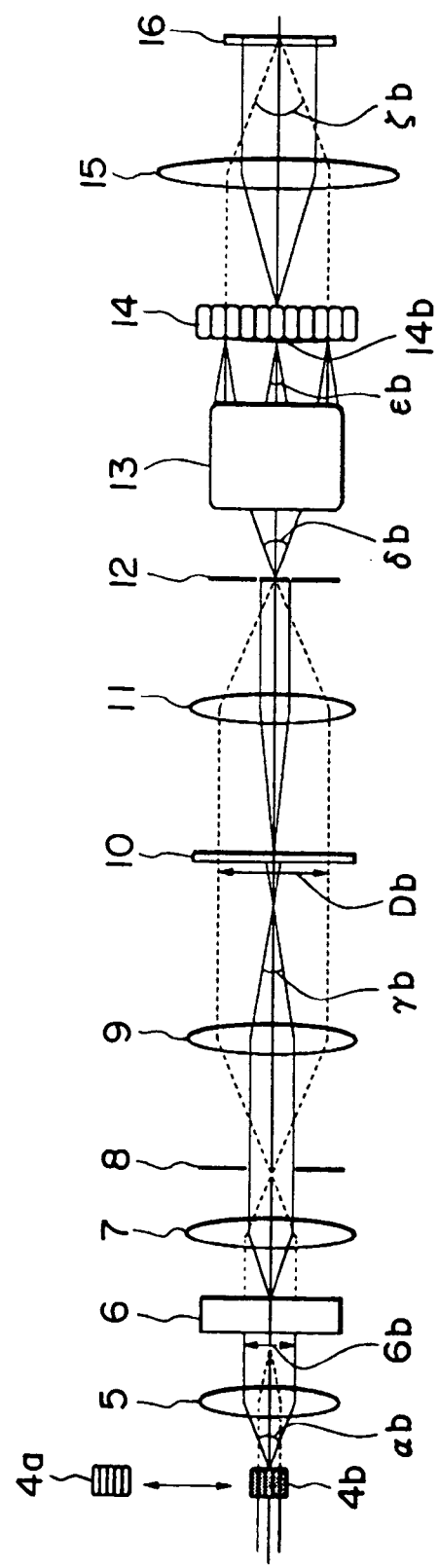
FIG. 6A
FIG. 6B

ILLUMINATION OPTICAL SYSTEM IN EXPOSURE APPARATUS

This application is a divisional application of U.S. patent application Ser. No. 09/821,024, filed Mar. 30, 2001 now U.S. Pat. No. 6,816,234.

FIELD OF THE INVENTION AND RELATED ART

This invention relates to an illumination system and, more particularly, to an illumination system suitably usable in an illumination optical system of an exposure apparatus for the manufacture of semiconductor devices, which uses as a light source an excimer laser of a vacuum ultraviolet wavelength region.

In a lithographic process among semiconductor device manufacturing processes, an exposure process for transferring, by exposure, a very fine pattern such as an electronic circuit pattern formed on the surface of a mask onto a wafer is prepared plural times, whereby electronic circuits are produced on the wafer.

As regards the exposure method used in the exposure process, there is a method in which a mask surface is held in contact with or in close proximity to a wafer surface and, in this stage, the mask surface is illuminated so that the pattern of the mask is transferred to the wafer surface. Also, there is a method in which a mask (reticle) placed at a position optically conjugate with a wafer surface is illuminated, and a pattern formed on the mask surface is transferred onto a wafer surface, by projection exposure, through a projection optical system. In any exposure method, the image quality of a pattern transferred to a wafer surface is largely influenced by the performance of the illumination system, for example, the uniformness of an illuminance distribution on the surface to be illuminated.

FIG. 10 is a schematic view of a general structure of a conventional illumination system, and it includes an inner type integrator and an amplitude division type integrator such as disclosed in Japanese Laid-Open Patent Application, Laid-Open No. 270312/1998.

In FIG. 10, laser light emitted by a laser light source 101 is once converged by a collimator lens 102 and then diverged, or alternatively, it is directly diverged by a negative lens, and the light is incident on an inside reflection surface of an optical pipe 103 at a predetermined divergent angle.

The divergent laser light having a divergent angle passes through the inside of the optical pipe 103 while being reflected thereby, and a plurality of apparent light source images of the laser light source 101 are produced on a plane (e.g., plane 110) perpendicular to the optical axis. Here, the laser beams, which appear as if they are emitted from the apparent light source images, are superposed one upon another on the light exit surface 103' of the optical pipe 103, such that a surface light source of uniform illuminance is produced at the light exit surface 103'. The light beam from the light exit surface 103' is directed by way of a condenser lens 104, an aperture stop 105 and a field lens 106, to the reticle 107 surface. Since the light exit surface 103' of the optical pipe 103 is in an optically conjugate relation with the reticle 107 surface, the reticle 107 surface is also illuminated uniformly.

If the shape of the optical pipe 103 is determined while taking into account the length and width of the optical pipe 103 and the divergent angle of the laser light provided by the collimator lens 102, the optical path differences of each laser beam emitted from the apparent light sources at the plane 110 toward each of the points on the reticle 107 surface can be more than the coherence length of the laser light. This reduces the coherence with respect to time, and prevents speckle on the reticle 107 surface.

However, in the structure of the illumination system shown in FIG. 10, a change in position of the light, to be caused frequently as a result of using a laser light source, may produce a variation in incidence angle of the light upon the surface being illuminated. This results in non-uniformness of illuminance, upon the surface being illuminated.

Further, in the illumination system of FIG. 10, multiple reflection is made at the inside reflection surface of the optical pipe so as to increase the number of apparent light source images, by which uniform illuminance is attained. However, in order to assure the illuminance uniforming effect, the reflection times should be increased and, therefore, the optical pipe should have a sufficient length. Since, however, in the vacuum ultraviolet region, absorption of light by the glass material, that is, a decrease of transmission factor, is large, if an optical pipe of a length that assures sufficient illuminance uniformness is used, the efficiency of light utilization may be degraded as a result of it.

SUMMARY OF THE INVENTION

It is accordingly an object of the present invention to provide an illumination system by which uniformness of a light intensity distribution upon a surface to be illuminated can be maintained even if light from a light source changes, and also by which the efficiency of light utilization is improved.

In accordance with an aspect of the present invention, there is provided an illumination system for illuminating a surface by use of light from a light source, said illumination system comprising: an emission angle conserving optical unit effective to emit the light from the light source at a constant divergent angle; and a diffractive optical element for producing a desired light intensity distribution on a predetermined plane, wherein said diffractive optical element is disposed at or adjacent to a position where light from said emission angle conserving optical unit is collected.

In one preferred form of this aspect of the present invention, the illumination system may further comprise a multiple-beam producing element, and a light projecting element for superposing light beams from said multiple-beam producing element one upon another on the surface to be illuminated, wherein the predetermined plane corresponds to a light entrance surface of said multiple-beam producing element.

The illumination system may further comprise a zoom optical system for projecting the light intensity distribution, produced by said diffractive optical element, upon the light entrance surface of said multiple-beam producing element at a predetermined magnification.

There may be a plurality of emission angle conserving optical units of different divergent angles, and wherein said emission angle conserving optical units are interchangeably set at a light path in accordance with a change in magnification of said zoom optical system.

An emission angle conserving optical unit placed at the light path may be changed by another, whereby a numerical aperture of light incident on the light entrance surface of said multiple-beam producing element is substantially registered with a preset numerical aperture of said multiple-beam producing means.

There may be a plurality of diffractive optical elements for producing different light intensity distributions on the predetermined plane, wherein said diffractive optical elements are interchangeably set at a light path to produce a desired light intensity distribution on the predetermined plane.

The diffractive optical element may be a phase type or an amplitude type computer hologram.

The emission angle conserving optical unit may comprise a fly's eye lens having small lenses arrayed two-dimensionally.

The emission angle conserving optical unit may comprise an aperture and a lens system.

In accordance with another aspect of the present invention, there is provided an exposure apparatus, comprising: an illumination optical system for illuminating a mask surface, as a surface to be illuminated, with use of light from a light source, said illumination optical system including (i) an emission angle conserving optical unit effective to emit the light from the light source at a constant divergent angle, and (ii) a diffractive optical element for producing a desired light intensity distribution on a predetermined plane, wherein said diffractive optical element is disposed at or adjacent to a position where light from said emission angle conserving optical unit is collected; and a projection optical system for projecting a pattern formed on the mask surface, as illuminated with the light from said illumination optical system, onto a wafer.

In accordance with a further aspect of the present invention, there is provided a device manufacturing method, comprising the steps of: applying a photosensitive material to a wafer; illuminating a mask surface, as a surface to be illuminated, with use of light from an illumination optical system, wherein the illumination optical system includes (i) an emission angle conserving optical unit effective to emit the light from the light source at a constant divergent angle, and (ii) a diffractive optical element for producing a desired light intensity distribution on a predetermined plane, wherein the diffractive optical element is disposed at or adjacent to a position where light from the emission angle conserving optical unit is collected; projecting, through a projection optical system, a pattern formed on the mask surface onto a wafer; and developing the transferred pattern.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are schematic views, respectively, for explaining a phase type CGH as an example of a diffractive optical element.

FIGS. 6A and 6B are schematic views, respectively, for explaining the interchanging of emission angle conserving optical units.

DESCRIPTION OF THE PREFERRED EMBODIMENTS

Preferred embodiments of the present invention will now be described with reference to the accompanying drawings.

Figure 1:
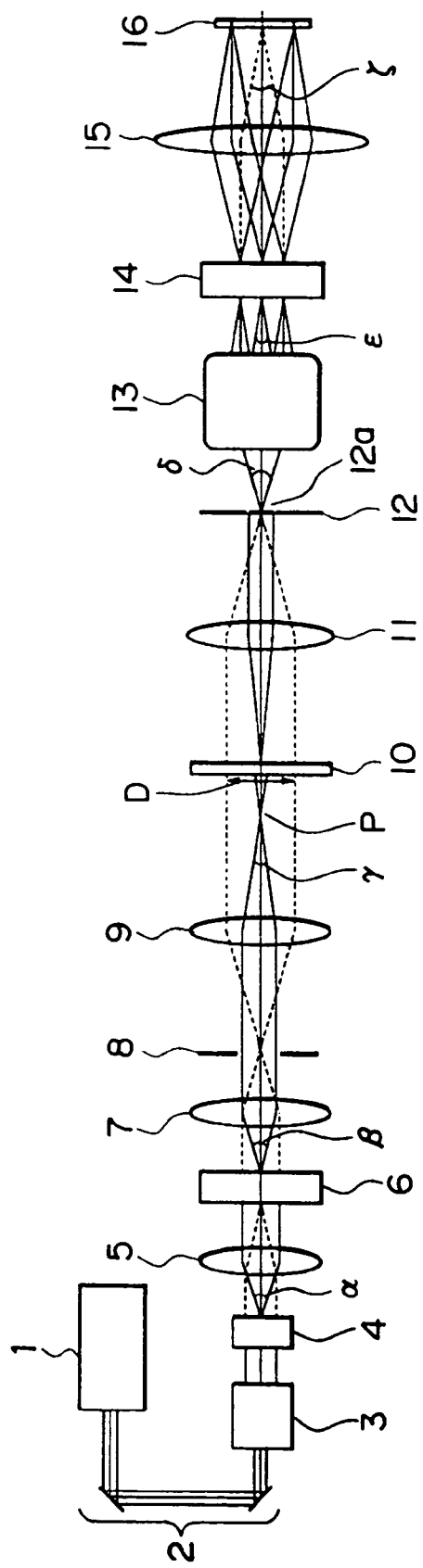
FIG. 1 is a schematic view of a general structure of an illumination system according to an embodiment of the present invention.

FIG. 1 is a schematic view of an illumination system according to an embodiment of the present invention. Denoted in the drawing at 1 is a laser light source, and denoted at 2 is a light directing optical system. Denoted at 3 is a beam shaping optical system, and denoted at 4 and 6 are emission angle conserving optical units. Denoted at 5 is a condensing optical system, and denoted at 7 and 9 are relay optical systems. Denoted at 8 is an aperture stop, and denoted at 10 is a diffractive optical element. Denoted at 11 is a relay optical system, and denoted at 12 is an aperture. Denoted at 13 is a zoom optical system, and denoted at 14 is a multiple-beam producing means. Denoted at 15 is a light projecting means including a condenser lens and the like. Denoted at 16 is a mask or reticle (surface to be illuminated) having a circuit pattern formed thereon.

The laser light source 1 may be any one of various excimer lasers such as KrF, ArF, and $F_2$, for example. The diffractive optical element 10 is a computer hologram designed to produce a desired illuminance distribution (circular, ring-like or quadrupole shape, for example) at the position of the aperture 12, through the relay optical system 11. An amplitude type hologram, a phase distribution type hologram or a Kinoform may be used for it. The aperture 12 has a function for passing therethrough only the illuminance distribution as produced by the diffractive optical element.

The multiple-beam producing means 14 comprises a fly's eye lens having a plurality of small lenses, or a fiber bundle, for example. A surface light source defined by a plurality of point light sources is formed on the light exit surface of the multiple-beam producing means. The small lenses constituting the fly's eye lens may be provided by a diffractive optical element or, alternatively, a micro-lens array. In this embodiment, multiple-beam producing means 14 refers to an optical element having plural optical axes and plural regions of finite areas around these optical axes, respectively, wherein, in each region, one light flux can be specified.

The laser beam emitted from the laser light source 1 is directed by way of the light directing optical system 2, including a mirror and a relay lens (not shown), and it enters the beam shaping optical system 3, which comprises a cylindrical lens and a mirror, for example. The beam sectional shape of the laser beam is transformed into a desired shape, by this beam shaping optical system 3. Then, the light enters the emission angle conversing optical unit 4.

Figure 2A:
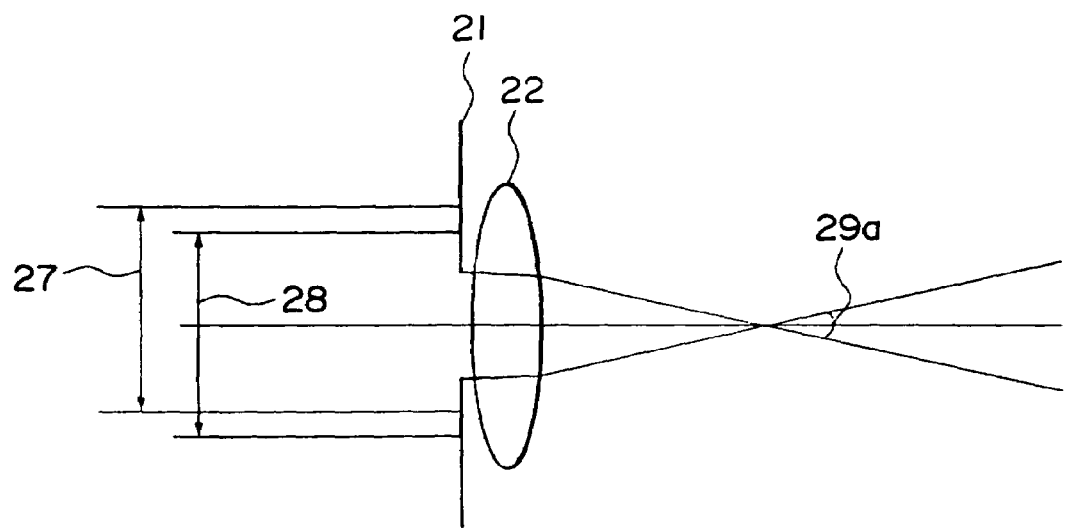
FIGS. 2A and 2B are schematic views, respectively, each for explaining an emission angle conserving optical unit.
Figure 2B:
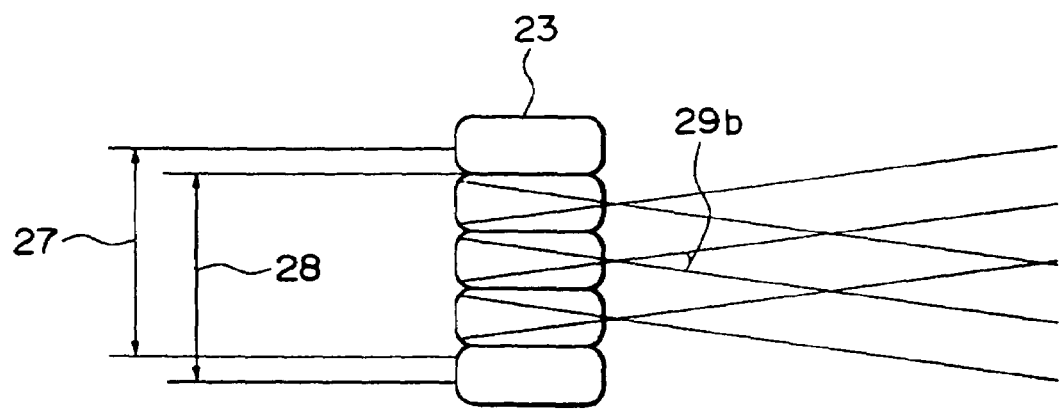

Here, as shown in FIG. 2A, the emission angle conserving optical unit 4 comprises an aperture 21 and a lens system 22. It has such a property that, even if the optical axis of the incident light shifts slightly as depicted at 27 or 28 in the drawing, the emission angle 29a of the light emitted therefrom is maintained constant. Alternatively, as shown in FIG. 2B, the emission angle conserving optical unit 4 may be provided by a fly's eye lens having small lenses. On that occasion, the emission angle 29b of the light is determined by the shape of the fly's eye lens. With the use of an emission angle conserving optical unit such as shown in FIG. 2B, the emission angle 29b of the emitted light can be held constant.

The light emitted from the emission angle conserving optical unit 4 at a desired emission angle $\alpha$ is collected by the condenser optical system 5, and it is directed to another emission angle conserving optical unit 6. Here, the light exit surface of the optical unit 4 and the light entrance surface of the optical unit 6 are placed in the relation of Fourier transform planes (the relation of an object plane and a pupil plane, or the relation of a pupil plane and an image plane), through the condenser optical system 5. Further, the emission angle $\alpha$ is held fixed. Therefore, even if the position of the light beam from the laser light source 1 shifts, the distribution of the light incident on the light entrance surface of the optical unit 6 is held fixed at the same position on the plane, constantly.

The emission angle conserving optical unit 6 has a similar structure and a similar function as those of the optical unit 4 described above, and the emission angle $\beta$ of the light emitted therefrom is constant.

The light emitted from the optical unit 6 at a desired emission angle $\beta$ is collected by the relay optical systems 7 and 9, and it is directed to the diffractive optical element 10. In this embodiment, the diffractive optical element 10 is disposed at or adjacent to a position which is optically conjugate with the light exit surface of the optical unit 6. With this structure, even if the light from the light source changes slightly, the incidence position and the divergent angle (or convergent angle) of the light entering the diffractive optical element 10 can always be controlled at desired values. As a result, the light intensity distribution to be produced at the surface can always be maintained constant. In FIG. 1, the element is disposed at a position slightly deviated from the convergence point P of the light rays emitted from arbitrary points on the light exit surface of the optical unit 6 (i.e., adjacent to a position optically conjugate with the light exit surface of the optical unit 6), and it is illuminated with incident light having a divergent angle (convergent angle) $\gamma$. This will be described in detail, with reference to FIGS. 3A and 3B.

Figure 3B:
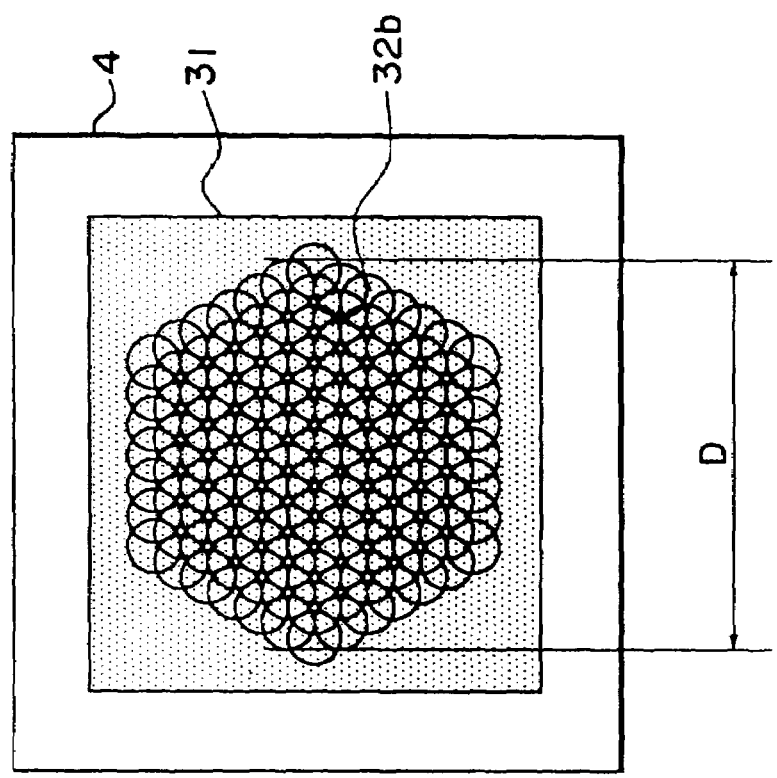
FIGS. 3A and 3B are schematic views, respectively, for explaining light incident on a diffractive optical element.
Figure 3A:
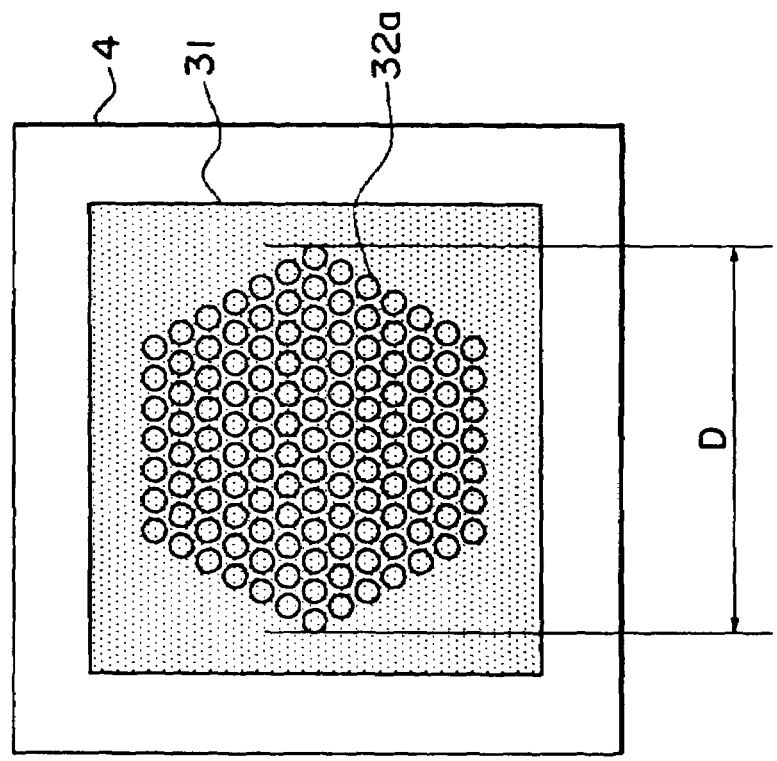

FIGS. 3A and 3B illustrate the state of incident light on the diffractive optical element 10. In these drawings, denoted at 31 is the surface of a diffractive optical element having a very fine step-like sectional structure formed on a substrate such as quartz, for example. Denoted at 32a and 32b is a single light spot to be produced by light from a single small lens, where the optical unit 6 comprises a fly's eye lens and where small lenses constituting the fly's eye lens have a honeycomb structure. Namely, a light beam provided by a large number of light spots 32a or 32b provide a light flux impinging on the diffractive optical element 10. Here, the width D of the light flux in FIG. 3A or 3B corresponds to the width D defined in FIG. 1 by broken lines intersecting the diffractive optical element 10.

The size of each light spot 32a or 32b differs with the relative distance between the diffractive optical element 10 and the convergence point P (i.e., deviation from the conjugate position of the light exit surface of the optical unit 6). By making this relative distance large, as shown in FIG. 3B, the size of the light spot 32b may be made large, such that the light spots are superposed one upon another on the diffractive optical element surface 31. By disposing the diffractive optical element 10 adjacent to the conjugate position of the light exit surface of the optical unit 6, as shown in FIG. 3B, damage to the element due to the energy concentration upon the diffractive optical element surface 31 can be prevented. The distance from the conjugate position of the light exit surface of the optical unit 6 whereat the diffractive optical element 10 is disposed, may preferably be kept so that a portion of the light spots 32b comes out of the diffractive optical element 10 surface.

Referring to FIGS. 4A and 4B, the diffractive optical element 10 will be explained. In this embodiment, a phase type computer hologram (CGH: Computer Generated Hologram) is used as the diffractive optical element 10. A computer hologram is a hologram which can be produced by calculating an interference fringe pattern to be formed by interference between object light and reference light and by directly outputting it by use of a pattern forming machine. An interference fringe shape to obtain a desired illuminance distribution as reproduced light can be easily determined by optimization based on repetition of calculations made by use of a computer. FIG. 4A is a front view of a phase type CGH produced in this manner. FIG. 4B schematically shows a sectional view along an arrow in FIG. 4A. In FIG. 4A, the phase distribution is illustrated by a tone distribution such as at 41. If the section is formed with a step-like shape such as depicted at 42 in FIG. 4B, the semiconductor device manufacturing technology can be applied to the manufacture of the same. Thus, a step-like structure having a very fine pitch can be produced relatively easily.

Figure 5C:
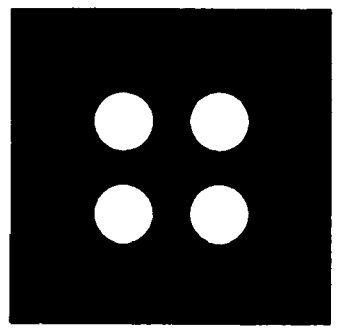
FIGS. 5A, 5B and 5C are schematic views, respectively, for explaining examples of illuminance distributions to be produced by a diffractive optical element.
Figure 5B:
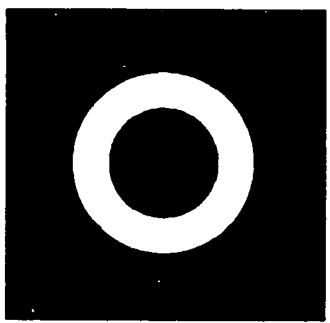
Figure 5A:
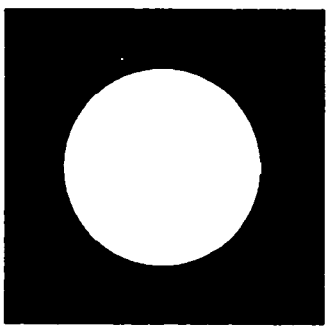

As regards the term "desired illuminance distribution" to be produced by the diffractive optical element 10, it may be a circular illuminance distribution (FIG. 5A), a ring-like illuminance distribution (FIG. 5B), or an illuminance distribution called a quadrupole (FIG. 5C), all being suitable in accordance with the exposure condition used. The illuminance distribution defined by the diffractive optical element 10 is projected onto the light entrance surface of the multiple-beam producing optical system 14, by means of the zoom optical system 13 (to be described later). Thus, the above-described arrangement provides modified or deformed illumination (oblique incidence illumination) means in an illumination system of a semiconductor exposure apparatus, which accomplishes improvements in the resolution performance. Further, a plurality of diffractive optical elements may be mounted on interchanging means such as a turret (not shown), so that they can be used interchangeably to change the illumination condition.

Referring back to FIG. 1, the light beam incident on the diffractive optical element 10 is amplitude-modulated or phase-modulated as calculated, and it is diffracted thereby. The light goes through the relay optical system 11, and a desired illuminance distribution 12a (as that of FIG. 5A, 5B or 5C) having a substantially uniform intensity within the distribution is produced at the position of the aperture 12.

Here, the diffractive optical element 10 and the aperture 12 are placed in the relation of Fourier transform planes. Based on this relationship, light diverged from an arbitrary single point on the diffractive optical element 10 contributes to the whole illuminance distribution 12a. Namely, in FIGS. 3A and 3B, by an arbitrary light beam which forms the light spot 32a or 32b, regardless of its irradiation position, an illuminance distribution 12a (as in FIGS. 5A–5C) suitable for the illumination can be produced at the aperture 12 position.

Here, in the illumination distribution 12a, since the light incident on the diffractive optical element 10 (CGH) has an extension angle $\gamma$, there occurs a small blur corresponding to this angle. The diffractive optical element 10 may be designed, as a matter of course, to produce a desired illuminance distribution while taking into account such blur, beforehand.

Next, a description will be made of the magnification change of the zoom optical system 13. A desired illuminance distribution 12a being substantially uniform within the distribution and being formed by the diffractive optical element 10, is projected by the zoom optical system 13 onto the light entrance surface of the multiple-beam producing optical system 14 at a desired magnification, as a uniform light source image 14a. Here, the term "desired magnification" refers to a magnification which functions to set the size of the uniform light source image so that the incidence angle ζ of the projected light on the surface 16 to be illuminated has a value best suited to the exposure.

If, with respect to a desired magnification m, the light entrance side NA (numerical aperture) of the zoom optical system 13 as determined by the angle δ is NA', and the light exit side NA (numerical aperture) of the zoom optical system as determined by the angle ε is NA", the following relation is obtained:

$$NA' = m \cdot NA'' \quad (1)$$

Here, as regards the magnitude of the angle ε, from the standpoint of illumination efficiency, preferably, it should be close, as much as possible to, but not exceeding, the NA with which the light can enter the multiple-beam producing means 14. Therefore, an optimum angle being dependent upon the multiple-beam producing means 14 is set. Thus, as seen from equation (1), once an optimum magnification for the exposure process in a certain condition is determined, the optimum angle of δ is also determined.

In this embodiment, the value of angle δ depends on the size of the width D (FIG. 3A or 3B) of the irradiation region of the light being incident on the diffractive optical element 10, and the magnitude thereof is dependent upon the emission angle α from the optical unit 4. On the basis of this, the emission angle conserving optical unit 4 is interchanged in accordance with the illumination condition, to change the width D of the irradiation region of the light impinging on the diffractive optical element 10. This will be described later in detail, with reference to FIG. 6.

When a uniform light source image is projected on the light entrance surface of the multiple-beam producing means 14 in the manner described above, the illuminance distribution on the light entrance surface is directly transferred to the light exit surface thereof. Then, light beams emitted from small regions of the multiple-beam producing means 14 are projected by the projecting means 15 onto the surface 6, to be illuminated, while beams are superposed one upon another. By this, the surface 16 can be illuminated with a generally uniform illuminance distribution.

Referring to FIGS. 6A and 6B, interchanging control of the emission angle conserving optical unit 4 will be described. In these drawings, denoted at 4a is an emission angle conserving optical unit having a smaller emission angle αa. Denoted at 4b is another emission angle conserving optical unit having a larger emission angle αb. The remaining elements are similar to those having been described with reference to FIG. 1.

Generally, in an illumination system to be used in an illuminance unit of a semiconductor device manufacturing exposure apparatus, it is required that the incidence angle of light to be projected on the surface to be illuminated can be set as desired. In this embodiment, a plurality of emission angle conserving optical units such as at 4a and 4b in FIG. 6 are mounted on a switching means such as a turret (not shown), and these optical units are interchangeably used in accordance with the requirement. With this arrangement, a desired incidence angle can be set to the light to be incident on the surface to be illuminated.

FIG. 6A corresponds to a case wherein the incident angle ζa of the light incident on the surface 16 is relatively small (this being called a small σ value). In this embodiment, in order to make the σ value small, the image 14a of the illuminance distribution to be produced by the diffractive optical element 10 on the light entrance surface of the multiple-beam producing means 14 should be imaged at a small magnification. Although this can be accomplished by changing the magnification of the zoom optical system 13, as described hereinbefore, the value ζa is set at an optimum angle dependent upon the entrance side NA of the multiple-beam producing means 14.

Therefore, as seen from equation (1), once the magnification for attaining a desired a value is determined, the divergent angle ζa of the light of the illuminance distribution, produced by the diffractive optical element 10 at the position of the aperture 12, is determined fixedly. While the angle δa is determined by the width Da of light incident on the diffractive optical element 10, this width is dependent upon the width 6a of light impinging on the optical unit 6. Thus, the emission angle conserving optical unit is changed to the unit 4a to set a smaller emission angle αa, thereby to narrow the light flux width 6a. With this procedure, illumination of a high efficiency and with a small angle ζa (small σ value) is accomplished.

On the other hand, FIG. 6B shows an example where the σ value is large. In this case, the emission angle conserving optical unit is changed to the unit 4b having a larger emission angle, to set the large emission angle αb. By this, the width Db of light incident on the diffractive optical element 10 is made large, and the angle δb of light diverged from the illuminance distribution as produced by the diffractive optical element 10 is made large. Even though the image 14b thereof is projected on the multiple-beam producing means 14 at a large magnification, from the relation of equation (1), the angle εb can be set to be substantially the same as the above-described angle εa. With this procedure, illumination of a high efficiency and with a large angle ζb (large σ value) is accomplished.

As regards the divergent angle of the light diverged from the diffractive optical element 10, since the angle γa (FIG. 6A) and the angle γb (FIG. 6B) are equal to each other, the divergent angle of diverged light is the same and, thus, the size of the illuminance distribution 12a at the aperture 12 position is unchanged even if the emission angle conserving optical units are interchanged.

As a matter of course, in order to obtain a desired illuminance distribution in response to the a value changing, if necessary, the diffractive optical element 10 may be interchanged by using a switching means such as a turret (not shown), simultaneously in response to the interchange of the optical units.

As has been described with reference to FIG. 2B, for example, even if the light from the laser light source 1 changes slightly due to any external disturbance, the emission angle of the light from the emission angle conserving optical unit 4 is conserved. Therefore, in FIG. 1, the position of the incident light on the optical unit 6 is unchanged. Further, since the emission angle of light from the optical unit 6 is also conserved, there occurs substantially no change in the position of the incident light on the diffractive optical element 10 or in the width of the light there. Thus, when the whole light source image inside the small lenses of the multiple-beam producing means 14 is viewed macroscopically, it can be said that substantially no change has occurred. Consequently, the influence to the illuminance distribution on the surface 9 to be illuminated becomes very small so that it can be disregarded. This clearly suggests the advantages of the present invention that the system is very stable against a change of light from the laser light source.

In accordance with embodiments of illumination systems according to the present invention, described hereinbefore, the following advantageous results are obtained.

(a) The incidence angle of light to the surface to be illuminated can be set at a desired value, and non-uniformness of illuminance can be reduced while attaining high-efficiency uniform illumination.

(b) Even if there occurs a change in the light in dependence upon the laser light source, the incidence angle of the light incident on the surface to be illuminated is stable. Thus, the adverse effects of the change to the exposure can be removed.

(c) Use of a diffractive optical element, having a small glass material thickness in place of an optical pipe, ensures an illumination system having a high efficiency even in a vacuum ultraviolet region in which the transmission factor is low.

For these reasons, an illumination system suitably usable, particularly, in an illumination optical system of a semiconductor device manufacturing exposure apparatus, is provided.

Next, a description will be made of an embodiment in which an illumination system of the present invention is applied to an illumination optical system of an exposure apparatus for the manufacture of semiconductor devices such as semiconductor chips (e.g., ICs or LSIs), liquid crystal panels, CCDs, thin film magnetic heads, or micromachines, for example.

Figure 7:
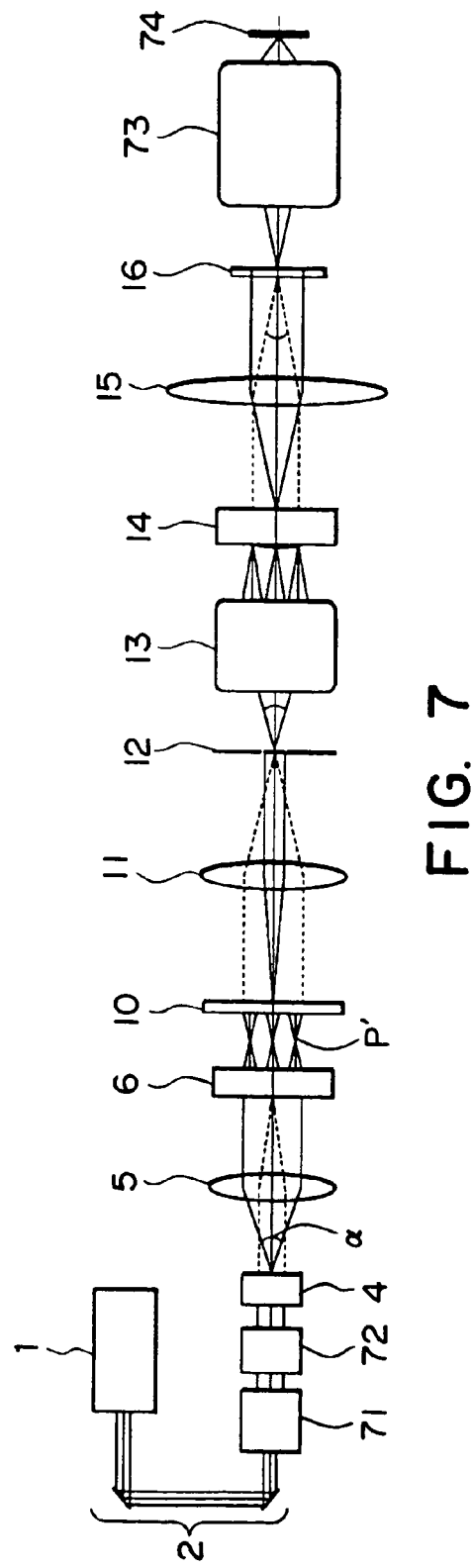
FIG. 7 is a schematic view of a main portion of an exposure apparatus according to an embodiment of the present invention.

FIG. 7 is a schematic view of a general structure of a semiconductor device manufacturing exposure apparatus.

Denoted in the drawing at 71 is a beam shaping optical system for transforming light from a laser light source 1 into a desired beam shape. Denoted at 72 is an incoherency transforming optical system for transforming a coherent laser beam into incoherent light. Denoted at 73 is a projection optical system, and denoted at 74 is a photosensitive substrate such as a wafer, for example, having a photosensitive material applied thereto. Like numerals as those of FIG. 1 are assigned to corresponding elements, and a description thereof is omitted.

The light emitted from the laser light source 1 is directed by way of a light directing optical system 2, and it enters the beam shaping optical system 71. The beam shaping optical system 71 comprises a plurality of cylindrical lenses or a beam expander, and it functions to transform the aspect ratio (longitudinal to lateral ratio) of the sectional shape of the light beam into a desired value.

The light thus shaped into a desired sectional shape by the beam shaping optical system 71 enters the incoherency transforming optical system 72 for preventing interference of light upon the wafer 74 surface and production of speckle thereon, whereby the light is transformed into incoherent light.

As regards the incoherency transforming optical system 72, an optical system such as disclosed in Japanese Laid-Open Patent Application, Laid-Open No. 215930/1991 may be used. In this optical system, the incident light is divided by a light dividing surface into at least two light beams (e.g., P-polarized light and S-polarized light) and, after an optical path length longer than the coherence length of the light is assigned to one of the divided light beams by use of an optical member, these light beams are directed again to the light dividing surface where one light beam is superposed on the other. By using a folding system such as above, mutually incoherent light beams are produced.

The incoherent light produced by the incoherency transforming optical system 72 enters the emission angle conserving optical unit 4, and it emits therefrom at a desired emission angle α. The light emitted from the optical unit 4 is collected by a condenser optical system 5 and is directed to the emission angle conserving optical unit 6. Here, the light exit surface of the optical unit 4 and the light entrance surface of the optical unit 6 are placed in the relation of Fourier transform planes through the condenser optical system 5. Further, the emission angle α is held fixed. Therefore, even if the optical axis of the light from the laser light source 1 shifts, the distribution of the light incident on the light entrance surface of the optical unit 6 is held fixed at the same position on the plane, constantly.

In the embodiment of FIG. 1, the light emitted from the optical unit 6 is collected by relay optical systems 7 and 9 and is directed to the diffractive optical element 10. In this embodiment, however, these relay optical systems are omitted, and the light is directly directed to the diffractive optical element 10. The diffractive optical element 10 is disposed at a position slightly deviated from the position of the light convention point P'.

In this case, the optical unit 6 may be a fly's eye lens such as shown in FIG. 6B. Alternatively, to such structure, small lenses of a diffractive optical element disposed in an array may be added. For the σ value changing as has been described with reference to FIGS. 6A and 6B, the optical unit 6 and the diffractive optical element 10 may be combined into an integral unit, and this may be interchanged.

Then, with the procedure as has been described with reference to FIG. 1, light beams emitted from the small regions of the multiple-beam producing means 14 are projected by the projecting means onto the surface 16 while being superposed one upon another. Thus, the surface 16 is illuminated with a generally uniform illuminance distribution. Then, the light which bears information about the circuit pattern, for example, formed on the surface 16 is projected and imaged by the projection optical system 73 onto the photosensitive substrate 74, at a magnification best suited to the exposure, whereby the circuit pattern is transferred there.

The photosensitive substrate 74 is held fixed by vacuum attraction, for example, to a photosensitive substrate stage (not shown). It can be moved in translation upwardly/downwardly and forwardly/backwardly in the sheet of the drawing. The motion thereof is controlled by means of a measuring device such as a laser interferometer (not shown), for example.

Although in this embodiment the surface 16 is illuminated with a generally uniform illuminance distribution, the emission angle of light emitted from each small region of the multiple-beam producing means 14 may be so set that different angles are defined with respect to two orthogonal directions. On that occasion, the surface 16 can be illuminated with a slit-like shape.

Next, an embodiment of a semiconductor device manufacturing method, which uses an exposure apparatus such as shown in FIG. 7, will be explained.

Figure 8:
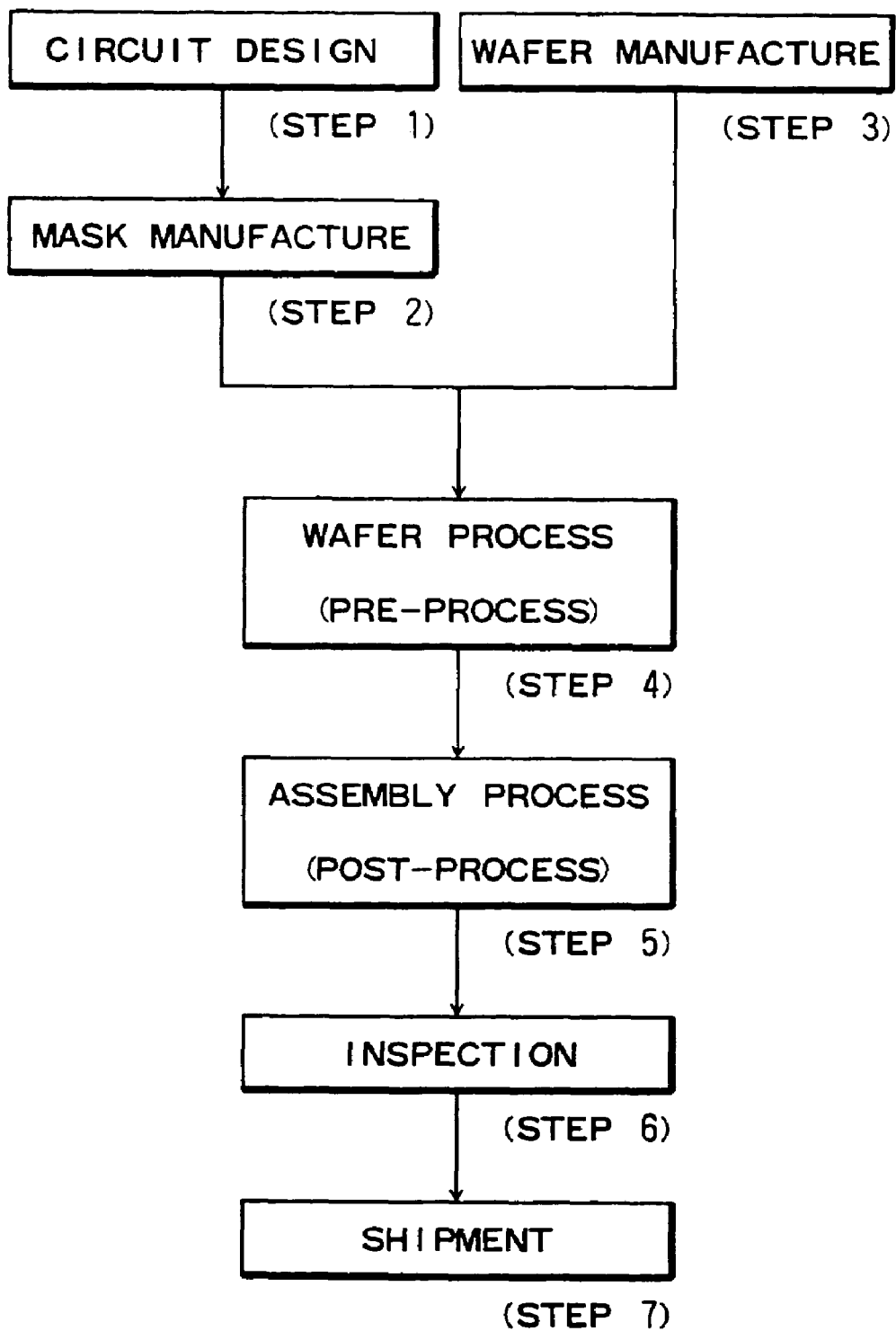
FIG. 8 is a flow chart for explaining semiconductor device manufacturing processes.

FIG. 8 is a flow chart of the procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
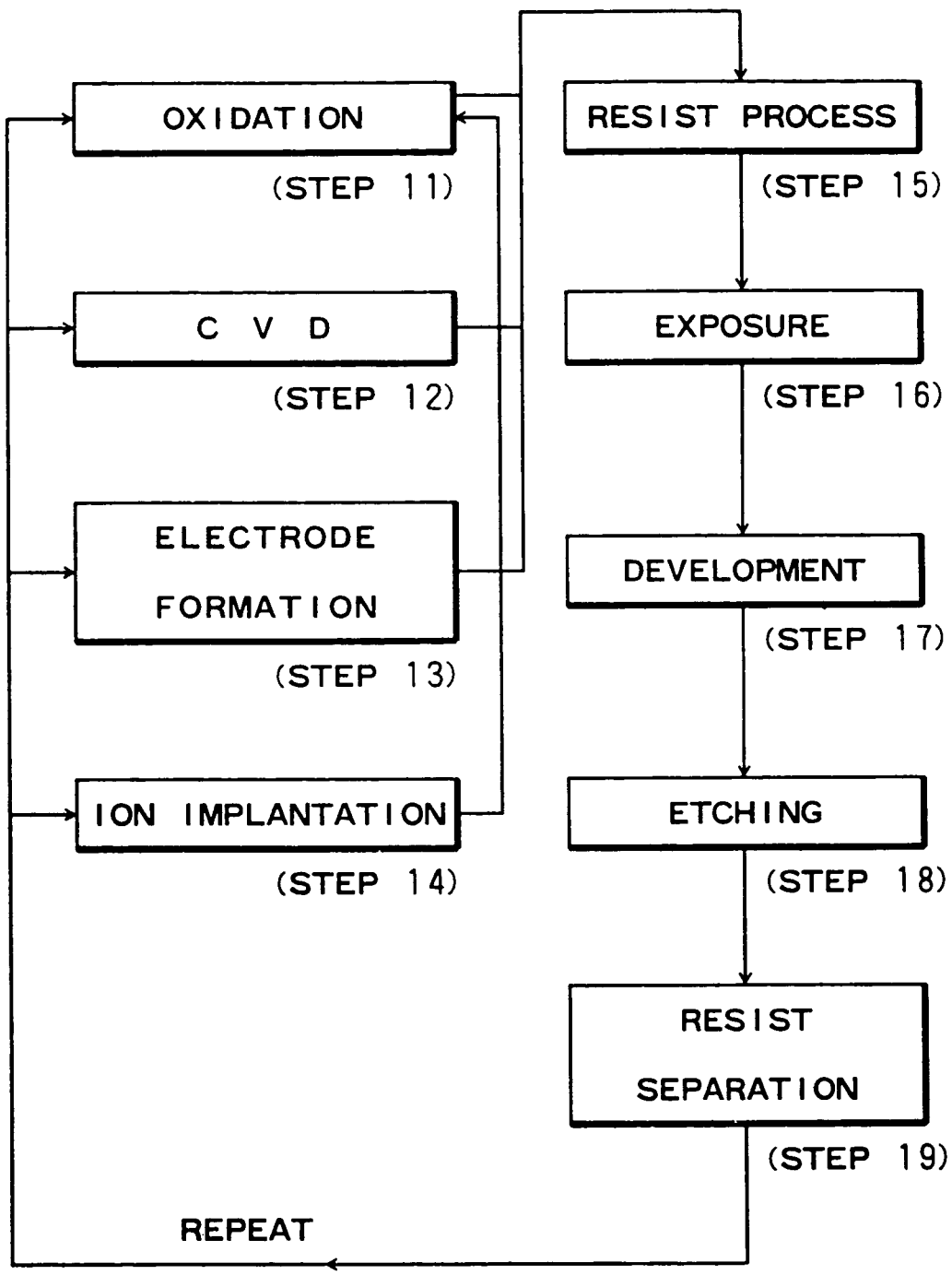
FIG. 9 is a flow chart for explaining details of a wafer process in the procedure of the flow chart of FIG. 8.
Figure 10:
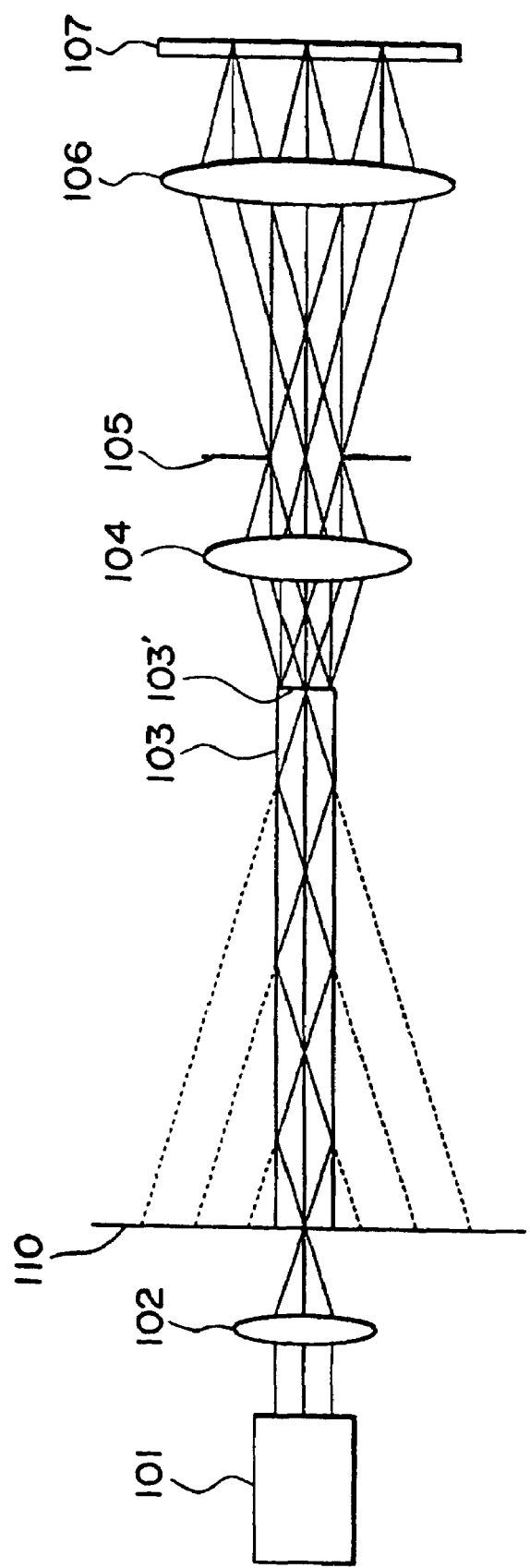
FIG. 10 is a schematic view of a general structure of a conventional illumination system.

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, even if the light from a light source changes, the illumination system can hold the uniformness of a light intensity distribution on the surface illuminated. Also, the light utilization efficiency is improved simultaneously.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   an illumination system for illuminating a mask with light from a light source; and
   a projection optical system for projecting a pattern of the mask onto a photosensitive substrate,
   wherein said illumination system includes (i) a first emission angle preserving optical unit for emitting light, received from the light source, at a predetermined divergence angle, and (ii) a diffractive optical element for forming a desired light intensity distribution upon a predetermined plane, by use of light from said first emission angle preserving optical unit, wherein said diffractive optical element is disposed at or adjacent to a position which is optically conjugate with a light exit surface of said first emission angle preserving optical unit.

2. An exposure apparatus according to claim 1, wherein said first emission angle preserving optical unit comprises a fly's eye lens having a plurality of lenses arrayed two-dimensionally, and wherein light spots formed on said diffractive optical element with light beams from said plurality of lenses are superposed one upon another.

3. An exposure apparatus according to claim 1, further comprising a multiple-beam producing element and a light projecting element, wherein said light projecting element serves to superpose light beams from said multiple-beam producing element one upon another on the surface to be illuminated, and wherein the predetermined plane is at a light entrance surface of said multiple-beam producing element.

4. An exposure apparatus according to claim 1, further comprising a multiple-beam producing element, a light projecting element and a zoom optical system, wherein said light producing element serves to superpose light beams from said multiple-beam producing element one upon another on the surface to be illuminated, wherein said zoom optical system serves to project, with a desired magnification, a light intensity distribution formed at a position optically conjugate with a light entrance surface of said multiple-beam producing element, onto the light entrance surface of said multiple-beam producing element, and wherein the predetermined plane is at a position optically conjugate with the light entrance surface of said multiple-beam producing element.

5. An exposure apparatus according to claim 4, further comprising a plurality of second emission angle preserving optical units having mutually different divergence angles, and switching means for selecting one of said plurality of second emission angle preserving optical units, to be present on a light path, in accordance with a change in magnification of said zoom optical system, wherein a light exit surface of said second emission angle preserving optical unit and the light entrance surface of said first emission angle preserving optical unit are placed in a Fourier transform surface relation.

6. An exposure apparatus according to claim 1, further comprising a second emission angle preserving optical unit for emitting light from the light source at a predetermined divergence angle, wherein a light exit surface of said second emission angle preserving optical unit and the light entrance surface of said first emission angle preserving optical unit are placed in a Fourier transform surface relation.

7. A device manufacturing method comprising:
   exposing a wafer by use of an exposure apparatus; and
   developing the exposed wafer,
   wherein the exposure apparatus includes (a) an illumination system for illuminating a mask with light from a light source, and (b) a projection optical system for projecting a pattern of the mask onto a photosensitive substrate, wherein the illumination system includes (i) a first emission angle preserving optical unit for emitting light, received from the light source, at a predetermined divergence angle, and (ii) a diffractive optical element for forming a desired light intensity distribution upon a predetermined plane, by use of light from the first emission angle preserving optical unit, and wherein the diffractive optical element is disposed at or adjacent to a position which is optically conjugate with a light exit surface of the first emission angle preserving optical unit.

8. An exposure apparatus comprising:
   an illumination system for illuminating a mask with light from a light source; and a projection optical system for projecting a pattern of the mask onto a photosensitive substrate, wherein said illumination system includes (i) a first emission angle preserving optical unit for emitting light, received from the light source, at a predetermined divergence angle, and (ii) a diffractive optical element for forming a desired light intensity distribution upon a predetermined plane, by use of light from said first emission angle preserving optical unit, and wherein said diffractive optical element and said first emission angle preserving optical unit are disposed adjacent to each other.

9. An exposure apparatus according to claim 8, wherein said first emission angle preserving optical unit comprises a fly's eye lens having a plurality of lenses arrayed two-dimensionally, and wherein light spots formed on said diffractive optical element with light beams from said plurality of lenses are superposed one upon another.

10. An exposure apparatus according to claim 8, further comprising a multiple-beam producing element and a light projecting element, wherein said light projecting element serves to superpose light beams from said multiple-beam producing element one upon another on the surface to be illuminated, and wherein the predetermined plane is at a light entrance surface of said multiple-beam producing element.

11. An exposure apparatus according to claim 8, further comprising a multiple-beam producing element, a light projecting element and a zoom optical system, wherein said light projecting element serves to superpose light beams from said multiple-beam producing element one upon another on the surface to be illuminated, wherein said zoom optical system serves to project, with a desired magnification, a light intensity distribution formed at a position optically conjugate with a light entrance surface of said multiple-beam producing element, onto the light entrance surface of said multiple-beam producing element, and wherein the predetermined plane is at a position optically conjugate with the light entrance surface of said multiple-beam producing element.

12. An exposure apparatus according to claim 11, further comprising a plurality of second emission angle preserving optical units having mutually different divergence angles, and switching means for selecting one of said plurality of second emission angle preserving optical units, to be present on a light path, in accordance with a change in magnification of said zoom optical system, wherein a light exit surface of said second emission angle preserving optical unit and the light entrance surface of said first emission angle preserving optical unit are placed in a Fourier transform surface relation.

13. An exposure apparatus according to claim 8, further comprising a second emission angle preserving optical unit for emitting light from the light source at a predetermined divergence angle, wherein a light exit surface of said second emission angle preserving optical unit and the light entrance surface of said first emission angle preserving optical unit are placed in a Fourier transform surface relation.

14. A device manufacturing method comprising:

exposing a wafer by use of an exposure apparatus; and developing the exposed wafer, wherein the exposure apparatus includes (a) an illumination system for illuminating a mask with light from a light source, and (b) a projection optical system for projecting a pattern of the mask onto a photosensitive substrate, wherein the illumination system includes (i) a first emission angle preserving optical unit for emitting light, from the light source, at a predetermined divergence angle, and (ii) a diffractive optical element for forming a desired light intensity distribution upon a predetermined plane, by use of light from the first emission angle preserving optical unit, and wherein the diffractive optical element and the first emission angle preserving optical unit are disposed adjacent to each other.

* * * * *